United States Patent
Alpert et al.

(10) Patent No.: US 6,807,659 B2
(45) Date of Patent: Oct. 19, 2004

(54) ROBUST DELAY METRIC FOR RC CIRCUITS

(75) Inventors: Charles Jay Alpert, Round Rock, TX (US); Chandramouli V. Kashyap, Round Rock, TX (US); Ying Liu, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 14 days.

(21) Appl. No.: 10/256,104

(22) Filed: Sep. 26, 2002

(65) Prior Publication Data

US 2004/0064798 A1 Apr. 1, 2004

(51) Int. Cl.[7] .............................................. G06F 17/50
(52) U.S. Cl. ................................................. 716/6; 716/5
(58) Field of Search ........................ 716/4–6; 703/2, 703/14, 22

(56) References Cited

U.S. PATENT DOCUMENTS

| | | | |
|---|---|---|---|
| 5,239,481 A | * 8/1993 | Brooks et al. | 716/6 |
| 5,689,685 A | * 11/1997 | Feldmann et al. | 703/2 |
| 6,023,573 A | * 2/2000 | Bai et al. | 703/2 |
| 6,041,170 A | * 3/2000 | Feldmann et al. | 703/2 |
| 6,349,272 B1 | * 2/2002 | Phillips | 703/2 |
| 6,434,729 B1 | 8/2002 | Alpert | |
| 2002/0069044 A1 | * 6/2002 | Berg et al. | 703/22 |

OTHER PUBLICATIONS

Sastry et al. "Estimating the minimum of partitioning and floorplanning problems", IEEE Transactions, vol. 10, Feb. 1991, pp. 273–282.*

* cited by examiner

*Primary Examiner*—Matthew Smith
*Assistant Examiner*—Naum B Levin
(74) *Attorney, Agent, or Firm*—Casimer K. Salys; Jack V. Musgrove

(57) ABSTRACT

Physical design optimizations for integrated circuits, such as placement, buffer insertion, floorplanning and routing, require fast and accurate analysis of resistive-capacitive (RC) delays in the network. A method is disclosed for estimating delays at nodes in an RC circuit by calculating a first and second impulse response moments of the RC circuit, and matching the impulse response moments to a Weibull distribution. Based on the match, a signal delay value is computed. The invention may thus be used to determine whether the RC circuit meets a desired optimization condition, based on the signal delay value. In the exemplary implementation, the signal delay value at a delay point is calculated by finding a percentile of the Weibull distribution corresponding to the delay point. This implementation is accurate and very efficient as it uses only two very small look-up tables.

15 Claims, 3 Drawing Sheets

ROBUST DELAY METRIC FOR RC CIRCUITS

BACKGROUND OF THE INVENTION

1. Field of the Invention

The present invention generally relates to standards of measurement (metrics) for characterizing features of electrical circuits, and more particularly to a method and system which provides a delay metric for resistive-capacitive (RC) networks, such as those in an integrated circuit.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cells types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip.

An IC chip is fabricated by first conceiving the logical circuit description, and then converting that logical description into a physical description, or geometric layout. This process is usually carried out using a "netlist," which is a record of all of the nets, or interconnections, between the cell pins. An electronic design automation (EDA) system typically receives one or more high level behavioral descriptions of an IC device (e.g., in HDL languages like VHDL, Verilog, etc.), and translates this high level design language description into netlists of various levels of abstraction. A layout typically consists of a set of planar geometric shapes in several layers. The layout is then checked to ensure that it meets all of the design requirements, particularly timing requirements. The result is a set of design files known as an intermediate form that describes the layout. The design files are then converted into pattern generator files that are used to produce patterns called masks by an optical or electron beam pattern generator. During fabrication, these masks are used to pattern a silicon wafer using a sequence of photolithographic steps. The process of converting the specifications of an electrical circuit into a layout is called the physical design.

Faster performance and predictability of responses are elements of interest in circuit designs. As process technology scales to the sub-micron regime, interconnect delays increasingly dominate gate delays. Consequently, physical design optimization tools such as floorplanning, placement, and routing are becoming more "timing-driven" than the previous generation of tools. For such a tool to be effective, it must be able to efficiently compute interconnect delay since several million delay calculations are required to optimize a design.

In certain types of circuits, delays exist based on circuit topology and circuit components. Delays are particularly acute in circuits having resistive and capacitive elements, or RC circuits, as they are called in the art. A schematic diagram showing a generalized RC circuit is shown in FIG. 1. Circuit designers continually search for efficient techniques for accurate estimation of these delays, while determining the particular circuit's response to a load. In particular, circuit designers want to be able to calculate reliable delay information when designing the circuit. To this end, several prior art metrics (i.e., computational methods) have been developed.

The Elmore delay metric, which calculates the first moment of the impulse response, is the most widely applied and simplest interconnect delay metric that still captures some amount of metal resistance effects. The Elmore metric provides an upper bound on delay given any input waveform because the RC circuit impulse response is unimodal and positively skewed. The Elmore delay metric is commonly utilized for performance optimization tasks such as floorplanning, placement, buffer insertion, wire sizing in part and global routing. The widespread use of the Elmore delay metric is due to its closed form expression, fast computation speed, and fidelity with respect to simulation. Closed form delay equations, such as Elmore delay metric, are certainly preferable due to both efficiency and ease of implementation, as long as they are sufficiently accurate.

Despite its wide usage, the Elmore delay metric is known to be extremely inaccurate at times because it ignores the resistive shielding of downstream capacitance. For example, in the simple RC network as shown in FIG. 1, the Elmore delay to capacitor C1 at node N1, is independent of the resistors (R2 to R10). The higher the value of these resistors, the more the downstream capacitance is shielded, i.e., the larger the error is for the Elmore approximation. Particular values may be chosen for the various circuit elements in FIG. 1, which can result in arbitrarily large errors when analyzed with the Elmore delay metric. Errors of up to several hundred percent have been recorded when the Elmore delay metric is utilized for sub-micron technologies. Errors from Elmore delay metric are generally much more pronounced for near-end nodes (nodes relatively close to the power source) than for far-end nodes (nodes relatively far from the power source) since resistive shielding is not as much of a factor for far-end nodes.

To achieve greater accuracy than the Elmore delay metric can provide requires additional moments of the impulse response. However, moment matching does not directly produce a delay approximation, but rather a reduced order response, which can be solved via nonlinear iterations. These iterations tend to dominate the runtime of the entire delay computation method. Thus, several prior art methods have sought to circumvent iterations by proposing delay approximations metrics that are direct functions of the circuit moments.

Several of the other traditional metrics are known to be more accurate but are either CPU intensive or difficult to implement. For example, moment matching via asymptotic waveform evaluation (AWE) is very accurate but too computationally expensive to use within a tight optimization loop. Two-pole variants of AWE are considerably faster and recognized to be more accurate than the Elmore delay metric, but are still relatively expensive, as nonlinear solution methods such as Newton-Raphson iterations need to be run to solve the transcendental equation. The computational cost of this approach is expensive and can have a negative impact on the overall speed of the physical optimization. Also, their solutions may be unstable, i.e., poles may be positive; hence special care has to be taken to ensure stability. First order delay estimates, which are derived from the dominant pole and corresponding residue, also requires subsequent Newton-Raphson iterations. The metric commonly referred to as PRIMO fits the moments of the impulse response to probability density functions by utilizing a table lookup operation. The h-gamma metric (which subsumes PRIMO) avoids time-shifting the distribution functions and matches the moments to the circuit's homogenous response. The gamma solution also requires a lookup table which is not trivial to build. The scaled Elmore delay metric shifts the Elmore approximation and the error, but does not change the relative delay error problem.

Another closed form RC delay metric is described in U.S. Pat. No. 6,434,729, which calculates two moments of impulse response for an RC circuit, and computes a delay value for each node of the circuit based on these two moments. Each node is analyzed to determine if the delay at the given node is at a desired optimization condition. While this metric is useful for calculating the 50% delay, it is inadequate for other delay points.

In light of the inherent drawbacks with using the various metrics currently available for measuring delays in RC circuits, it would be desirable to devise an improved method having greater reliability and accuracy in computing delays in a RC circuit of any topology. It would be further advantageous if the method would allow for efficient, reliable and non-complex computation of delay in an RC circuit to permit optimization in circuit design.

SUMMARY OF THE INVENTION

It is therefore one object of the present invention to provide an improved method of measuring delay in a resistive-capacitive (RC) network.

It is another object of the present invention to provide such a method which can be efficiently used for performance optimization of a circuit design.

It is yet another object of the present invention to provide a system and method for providing a standardized measurement of RC circuits which offer an intuitive physical interpretation of the degree of resistive shielding.

The foregoing objects are achieved in a method of estimating delays at nodes in an RC circuit, generally comprising the steps of calculating a first impulse response moment and a second impulse response moment of the RC circuit, and matching the impulse response moments to a Weibull distribution. Based on the match, a signal delay value is computed. The invention may thus be used to determine whether the RC circuit meets a desired optimization condition, based on the signal delay value. In the exemplary implementation, the signal delay value at a delay point is calculated by finding a percentile of the Weibull distribution corresponding to the delay point. This implementation is accurate and very efficient as it uses only two very small look-up tables. A resistive shielding factor is found using the first table, and a gamma function is evaluated using the second table.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 2:
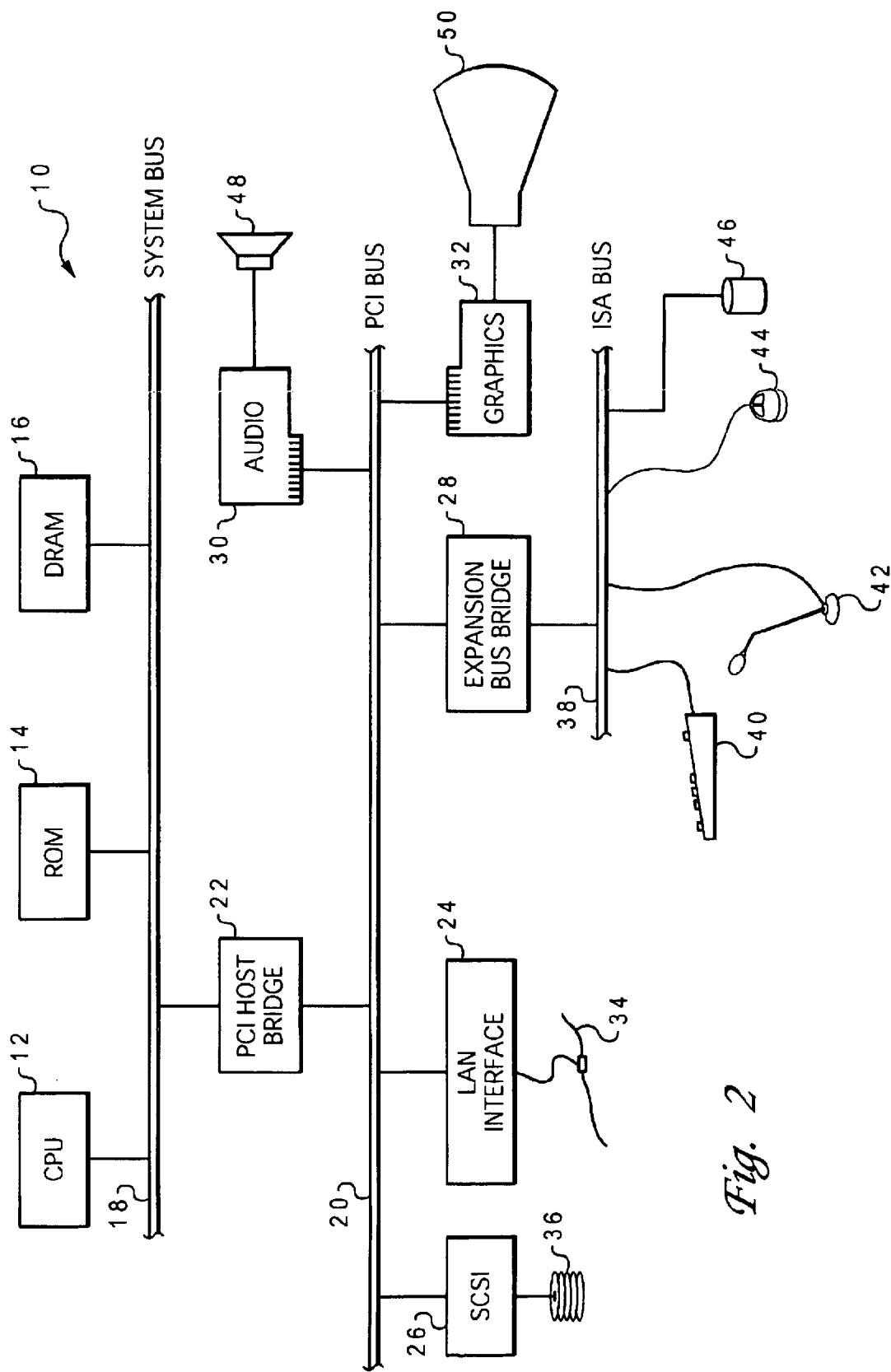
FIG. 2 is a block diagram of a computer system programmed to carry out computer-aided design of an integrated circuit in accordance with one implementation of the present invention.

With reference now to the figures, and in particular with reference to FIG. 2, there is depicted one embodiment 10 of a computer system programmed to carry out computer-aided design of an integrated circuit in accordance with one implementation of the present invention. System 10 includes a central processing unit (CPU) 12 which carries out program instructions, firmware or read-only memory (ROM) 14 which stores the system's basic input/output logic, and a dynamic random access memory (DRAM) 16 which temporarily stores program instructions and operand data used by CPU 12. CPU 12, ROM 14 and DRAM 16 are all connected to a system bus 18. There may be additional structures in the memory hierarchy which are not depicted, such as on-board (L1) and second-level (L2) caches.

CPU 12, ROM 14 and DRAM 16 are also coupled to a peripheral component interconnect (PCI) local bus 20 using a PCI host bridge 22. PCI host bridge 22 provides a low latency path through which processor 12 may access PCI devices mapped anywhere within bus memory or I/O address spaces. PCI host bridge 22 also provides a high bandwidth path to allow the PCI devices to access DRAM 16. Attached to PCI local bus 20 are a local area network (LAN) adapter 24, a small computer system interface (SCSI) adapter 26, an expansion bus bridge 28, an audio adapter 30, and a graphics adapter 32. LAN adapter 24 may be used to connect computer system 10 to an external computer network 34, such as the Internet. A small computer system interface (SCSI) adapter 26 is used to control high-speed SCSI disk drive 36. Disk drive 36 stores the program instructions and data in a more permanent state, including the program which embodies the present invention as explained further below. Expansion bus bridge 28 is used to couple an industry standard architecture (ISA) expansion bus 38 to PCI local bus 20. As shown, several user input devices are connected to ISA bus 38, including a keyboard 40, a microphone 42, and a graphical pointing device (mouse) 44. Other devices may also be attached to ISA bus 38, such as a CD-ROM drive 46. Audio adapter 30 controls audio output to a speaker 48, and graphics adapter 32 controls visual output to a display monitor 50, to allow the user to carry out the integrated circuit design as taught herein.

While the illustrative implementation provides the program instructions embodying the present invention on disk drive 36 (storage media), those skilled in the art will appreciate that the invention can be embodied in a program product utilizing other computer-readable media, including transmission media. In one embodiment, the computation steps of the invention may be implemented as program code using a programming language, such as C++.

Computer system 10 carries out program instructions for electronic design automation (EDA) in the design of an integrated circuit, and in particular uses a novel and very efficient (inexpensive) technique to accurately analyze delays in a resistive-capacitive (RC) network. Accordingly, the program may include conventional aspects of various EDA tools and analyzers, and these details will become apparent to those skilled in the art upon reference to this disclosure.

Figure 1:
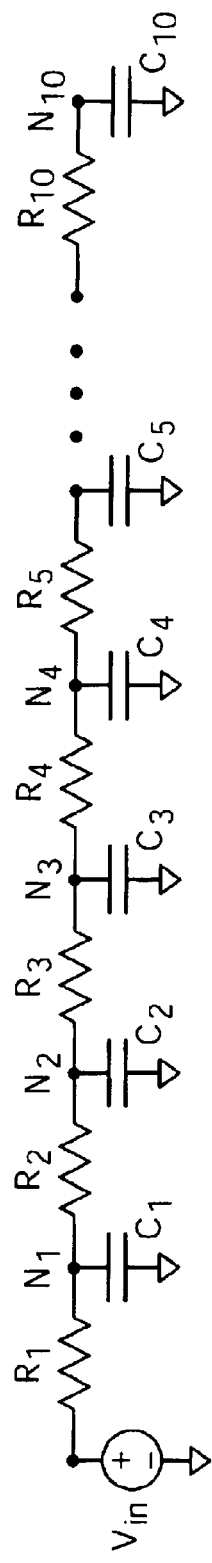
FIG. 1 is a schematic diagram of a generalized resistive-capacitive (RC) circuit which may be analyzed according to the present invention.

In the exemplary embodiment, computer system 10 is programmed to calculate an RC delay metric for a circuit in which two circuit moments are used to match the circuit's impulse response to a Weibull distribution. The invention is used to analyze RC circuits, such as the generalized circuit shown in FIG. 1. The ease with which the invention is implemented permits a designer to efficiently analyze multiple design topologies to obtain the best or most efficient topology of a circuit. The invention thus finds applicability in determining the best path to route wires/interconnects within the circuit, the optimum placement of logic blocks within the circuit, appropriate sizing of wires used within the circuit, etc.

The characteristics of the Weibull distribution make the resulting delay metric easy to implement (simpler than previous distribution-based methods) and very robust. As explained further below, once the Weibull-based delay parameters are calculated, the delay at any percentage point can be expressed as a closed form function. Experiments demonstrate that the Weibull-based delay metric achieves the same accuracy as prior art metrics, such as PRIMO, but does not generate unrealistic results as PRIMO occasionally does. Furthermore, the parameters of the Weibull-based delay metric have clear, intuitive circuit interpretations.

A Weibull distribution, denoted as WEI ($\alpha,\beta$), is determined by the two parameters $\alpha,\beta$. Its probability distribution function (PDF) is defined as $$P_{WEI}(t) = \alpha \beta^{-\alpha} t^{\alpha-1} e^{-(t/\beta)^\alpha} \text{ for } t, \alpha, \beta > 0$$

while its cumulative density function (CDF) is defined as $$C_{WEI}(t) = 1 - e^{-(t/\beta)^\alpha}.$$

Figure 3:
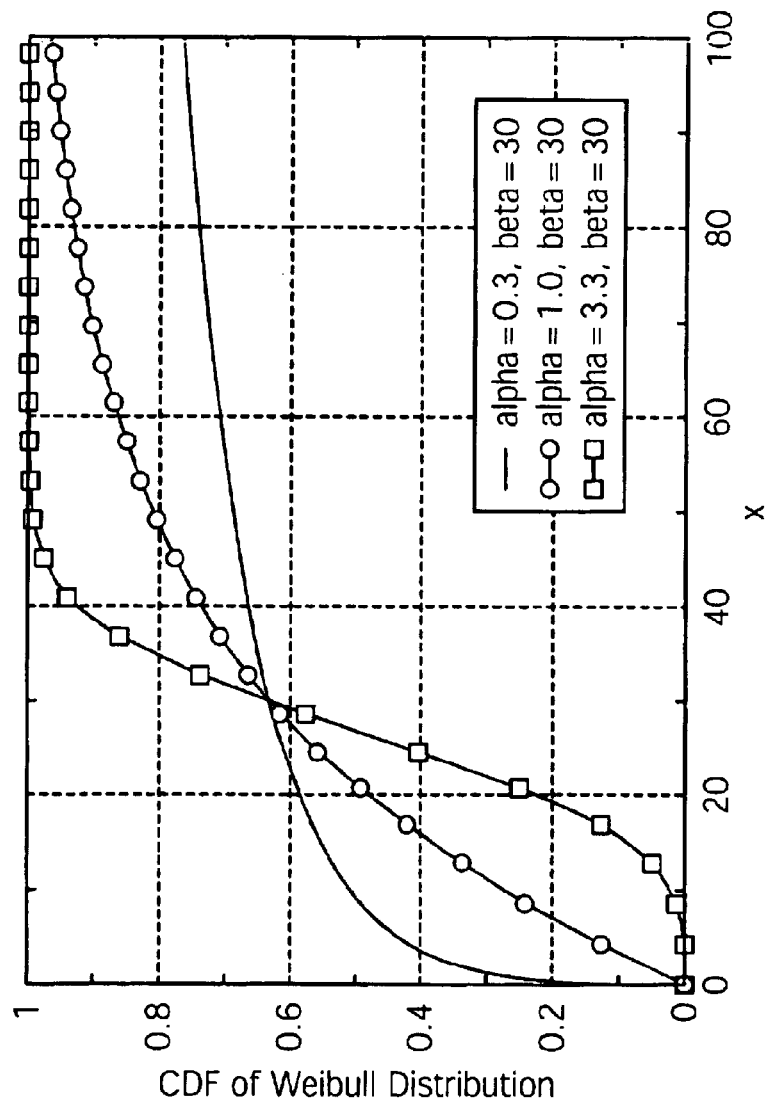
FIG. 3 is a graph illustrating the cumulative density functions of the Weibull distribution with one parameter ($\beta$) fixed, but different shape parameters ($\alpha$)

Unlike a gamma distribution, the CDF of the Weibull distribution is explicit, which is a computational advantage of the Weibull distribution. The parameter a is referred to as the shape parameter. Depending on whether $\alpha<1$, $\alpha=1$, or $\alpha>1$, the Weibull CDF shows three different basic shapes, as shown in FIG. 3. The statistical characteristics of Weibull distribution involve gamma function ($\Gamma$). It is convenient to define a further parameter $\theta=1/\alpha$ in the Weibull-based delay metric formulation. The mean and variance of the Weibull distribution may then be expressed as $$\mu_{WEI} = \beta \Gamma(1+\theta), \text{ and}$$

$$\sigma^2_{WEI} = \beta^2 [\Gamma(1+2\theta) - \Gamma^2(1+\theta)].$$

Variance is an intuitive measure which describes how wide the response curve is spread. Other characteristics (e.g., skewness) of Weibull distribution are available according to probability theory.

In the preferred implementation, the present invention constructs a Weibull distribution by matching the mean and variance. According to probability theory, it can be shown that mean and variance can also be expressed as $$\mu = -m_1, \text{ and}$$

$$\sigma^2 = 2m_2 - m_1^2$$

where $m_1$ and $m_2$ are the first two circuit moments. The moments of an RC circuit (such as the circuit shown in FIG. 1) are defined as the coefficients of the Taylor expansion for the Laplace transformation of the impulse response of a node voltage in the circuit. The circuit moments may be computed efficiently, e.g., by path tracing as is known in the art. Matching the first set of mean and variance equations to the second set of equations results in $$[\Gamma(1+2\theta)]/[\Gamma^2(1+\theta)] = 2m_2/m_1^2.$$

By assigning $r = m_2/m_1^2$, this equation can be rewritten as $$r = [\Gamma(1+2\theta)]/2[\Gamma^2(1+\theta)].$$

While this equation appears complicated, it can be easily solved by a simple table look-up operation, such as an operation based on Table 1. Because the relationship between $\theta$ and r is exponential, using entries of $\log_{10}(r)$ is more accurate.

TABLE 1

| r | $\log_{10}(r)$ | $\theta$ |
|---|---|---|
| 0.63096 | −0.2 | 0.48837 |
| 0.79433 | −0.1 | 0.76029 |
| 1.0 | 0.0 | 1.00000 |
| 1.25892 | 0.1 | 1.22371 |
| 1.58489 | 0.2 | 1.43757 |
| 1.99526 | 0.3 | 1.64467 |
| 2.51189 | 0.4 | 1.84678 |
| 3.16228 | 0.5 | 2.04507 |
| 3.98107 | 0.6 | 2.24031 |
| 5.01187 | 0.7 | 2.43305 |
| 6.30957 | 0.8 | 2.62371 |
| 7.94328 | 0.9 | 2.81262 |
| 10.0 | 1.0 | 3.00000 |
| 12.58925 | 1.1 | 3.18607 |
| 15.84893 | 1.2 | 3.37098 |

Once $\theta$ is known, parameter $\beta$ is calculated as $$\beta = -m_1/[\Gamma(1+\theta)].$$

The evaluation of this gamma function is also trivial, as will become apparent to those skilled in the art. Gamma function is included in many math packages and libraries of data processing tools. Alternatively, the gamma function can also be implemented as a look-up table. Since the solution for $\theta$ is always positive, the gamma function $\Gamma(x)$ need only be evaluated for $x>1$. Further, due to the recursive property of the gamma function, the look-up table need only store values between 1 and 2. Table 2 has been found to be quite accurate.

TABLE 2

| x | GAMMA(x) |
|---|---|
| 1.0 | 1.0 |
| 1.1 | 0.95135 |
| 1.2 | 0.91817 |
| 1.3 | 0.89747 |
| 1.4 | 0.88726 |
| 1.5 | 0.88623 |
| 1.6 | 0.89352 |
| 1.7 | 0.90864 |
| 1.8 | 0.93138 |
| 1.9 | 0.96176 |
| 2.0 | 1.0 |

Once the connection between the PDF function and impulse response curve is established, calculating signal delay at the $100 \cdot \phi$ % point is equivalent to finding the $\phi$ percentile of the underlying statistical distribution. The equation to be solved for the CDF of a Weibull distribution is $$1 - e^{-(t/\beta)^{(1/\theta)}} = \phi$$

which yields the solution $$t_\phi = \beta \cdot \{1n[1/(1-\phi)]\}^\theta.$$

In particular, the 50% delay point can be calculated as $$t_{0.5} = \beta \cdot [1n(2)]^\theta \approx 0.693^\theta.$$

Figure 4:
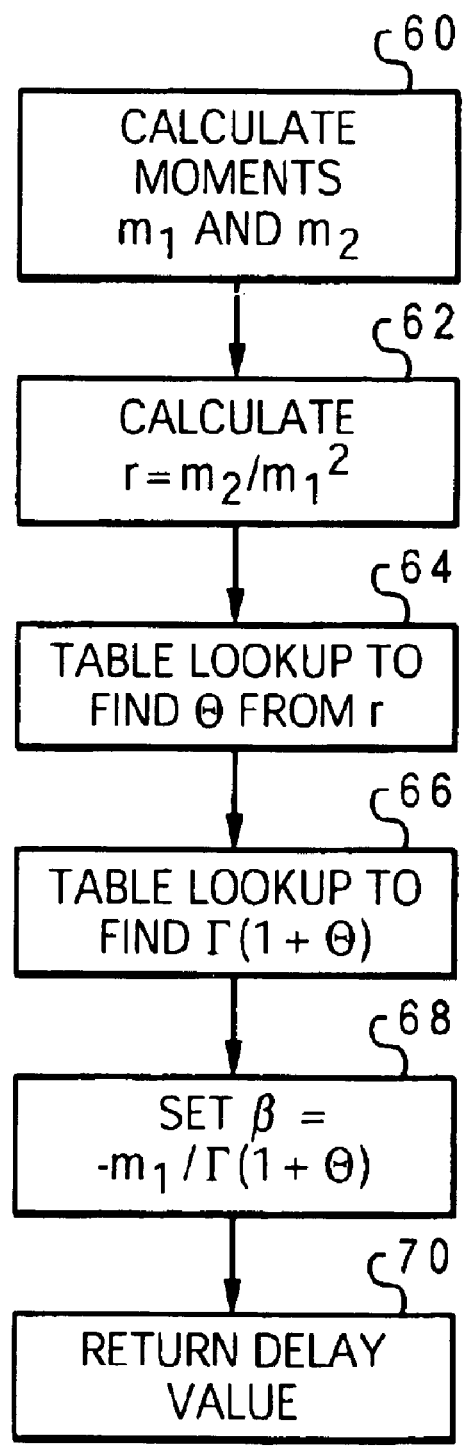
FIG. 4 is a chart depicting the logical flow according to one implementation of the present invention, wherein an RC delay value is returned based on a match of circuit impulse response moments to a Weibull distribution.

The foregoing implementation of the present invention maybe further understood with reference to the flow chart of FIG. 4. The first step is to calculate the two circuit impulse response moments $m_1$ and $m_2$ (60). The ratio r is then calculated from these moments, as $r = m_2/m_1^2$ (62). A table look-up (Table 1) is used to find $\theta$ from r (64). Another table look-up (Table 2) is used to find $\Gamma(1+\theta)$ (66). The distribution parameter is then set to $\beta = -m_1/\Gamma(1+\theta)$ (68). The final step returns the appropriate delay value, e.g., a 50% delay value of $\beta \cdot 0.693^\theta$ (70).

Empirical observations support the conclusion that $\theta$ can be used as a resistive shielding factor, to provide a quantitative description of the degree of resistive shielding. A resistive shielding factor of larger than 1 indicates that the node is strongly shielded, while a shielding factor of less than 1 indicates that the node is under shielded.

Some delay metrics are not guaranteed to return non-negative real values. A Weibull distribution is stable when both $\alpha$ and $\beta$ are positive. For an RC circuit the second impulse response moment is always positive, so $\theta$ is guaranteed to be positive for any node in the circuit. Also, for an RC circuit, the first impulse response moment is always negative, so the gamma function is always positive, as long as $\theta$ is positive. Accordingly, the Weibull-based delay metric will always return a nonnegative value for delay for any RC circuit.

This technique is quite robust and has satisfactory accuracies at both near- and far-end nodes. The invention is also straightforward to implement, and very efficient, using only two small lookup tables, one having 15 entries, and the other having 11 entries. Experiments have shown that the present invention provides satisfactory results when prior art approaches, such as PRIMO, might yield unrealistic results.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A method of estimating delays at nodes in an RC circuit, comprising the steps of:
   calculating a first impulse response moment and a second impulse response moment of the RC circuit; and
   matching the first and second impulse response moments to a Weibull distribution, wherein said matching step includes the step of computing a signal delay value at a delay point by finding a percentile of the Weibull distribution corresponding to the delay point.

2. The method of claim 1, further comprising the step of determining whether the RC circuit meets a desired optimization condition based on the signal delay value.

3. The method of claim 1 wherein said computing step uses no more than two table look-ups.

4. The method of claim 3 wherein said computing step further includes the step of finding a resistive shielding factor from a first table.

5. The method of claim 4 wherein said computing step further includes the step of evaluating a gamma function using a second table.

6. A data processing system for estimating delays at nodes in an RC circuit, comprising:
   means for processing program instructions;
   a memory device connected to said processing means; and
   program instructions residing in said memory device for calculating a first impulse response moment and a second impulse response moment of the RC circuit, and matching the first and second impulse response moments to a Weibull distribution, wherein the matching of the first and second impulse response moments includes computing a signal delay value at a delay point by finding a percentile of the Weibull distribution corresponding to the delay point.

7. The data processing system of claim 6, wherein said program instructions further determine whether the RC circuit meets a desired optimization condition based on the signal delay value.

8. The data processing system of claim 6, wherein said program instructions use no more than two table look-ups for the computing of the signal delay.

9. The data processing system of claim 8, wherein said program instructions further find a resistive shielding factor from a first table.

10. The data processing system of claim 9, wherein said program instructions further evaluate a gamma function using a second table.

11. A computer program product for estimating delays at nodes in an RC circuit, comprising:
    a computer-readable medium; and
    program instructions residing in said medium for calculating a first impulse response moment and a second impulse response moment of the RC circuit, and matching the first and second impulse response moments to a Weibull distribution, wherein the matching of the first and second impulse response moments includes computing a signal delay value at a delay point by finding a percentile of the Weibull distribution corresponding to the delay point.

12. The computer program product of claim 11, wherein said program instructions further determine whether the RC circuit meets a desired optimization condition based on the signal delay value.

13. The computer program product of claim 11, wherein said program instructions use no more than two table look-ups for the computing of the signal delay.

14. The computer program product of claim 13 wherein said program instructions further find a resistive shielding factor from a first table.

15. The computer program product of claim 14 wherein said program instructions further evaluate a gamma function using a second table.

* * * * *